Figure 1A:
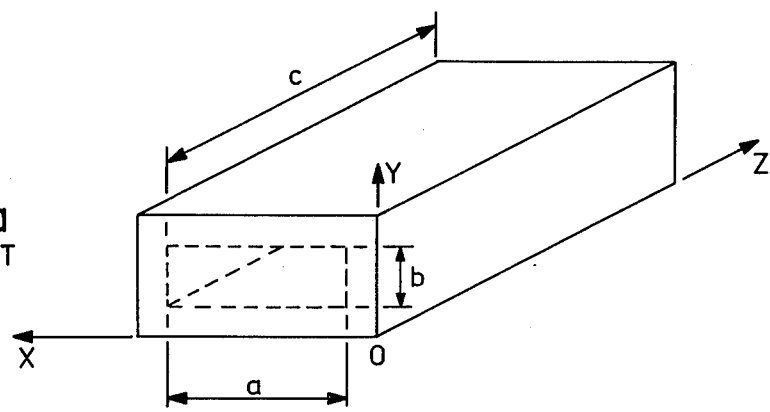

United States Patent [19]

Shirai

[11] Patent Number: 4,462,007

[45] Date of Patent: Jul. 24, 1984

[54] OUTPUT COUPLING CIRCUIT FOR A CAVITY OSCILLATOR

[75] Inventor: Tadao Shirai, Tokyo, Japan

[73] Assignee: Nippon Electric Co., Ltd., Tokyo, Japan

[21] Appl. No.: 240,876

[22] Filed: Mar. 5, 1981

[30] Foreign Application Priority Data

Mar. 5, 1980 [JP] Japan .................................. 55-27542

[51] Int. Cl.³ .......................... H03B 7/14; H03B 9/14
[52] U.S. Cl. ................................ 331/96; 331/107 DP
[58] Field of Search ............. 331/96, 97, 98, 107 DP, 331/117 D

[56] References Cited

U.S. PATENT DOCUMENTS 3,474,351 10/1969 Cook et al. .................... 331/107 DP
3,919,666 11/1975 Posner et al. ................. 331/107 DP Primary Examiner—Siegfried H. Grimm
Attorney, Agent, or Firm—Laff, Whitesel, Conte & Saret

[57] ABSTRACT

A microwave oscillator has a cavity resonator enclosed by conducting walls and containing a microwave oscillator element therein. A biasing device applies a bias voltage to the microwave oscillator element to generate a microwave signal. A microwave coupling circuit takes the microwave signal from the resonator in a direction which is perpendicular to the direction of the propagation of the microwave signal in the resonator and applies the taken-out microwave signal to an output means. The microwave coupling circuit is located at a position corresponding to one of the nodes of the electric field appearing in the cavity. The coupling circuit also is preferably at a position on the resonator wall which is a quarter wavelength away from the oscillator element. The undesired signals can be effectively suppressed in the output means, by −44 dB, or more, without making use of a filter. The suppressed signals especially include an electro-magnetic energy component of the second harmonics signal appearing at a frequency band which is twice as high as the fundamental oscillating frequency.

3 Claims, 20 Drawing Figures

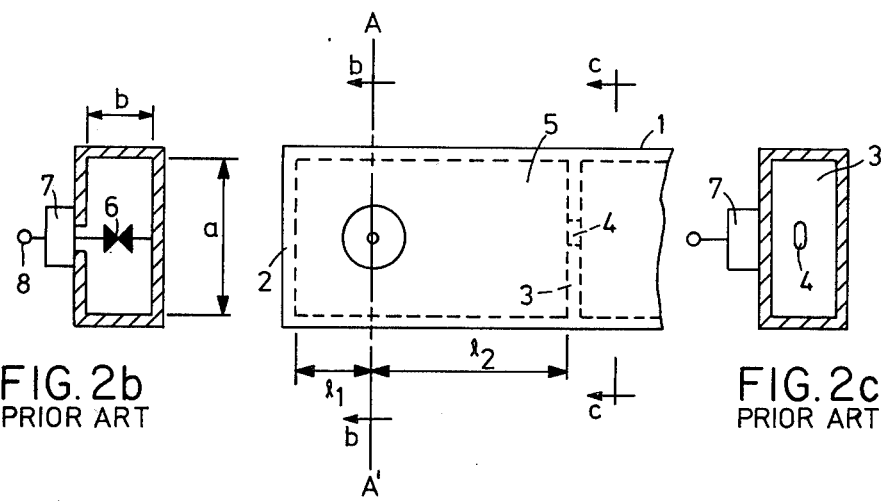
FIG. 2b PRIOR ART
FIG. 2a PRIOR ART
FIG. 2c PRIOR ART
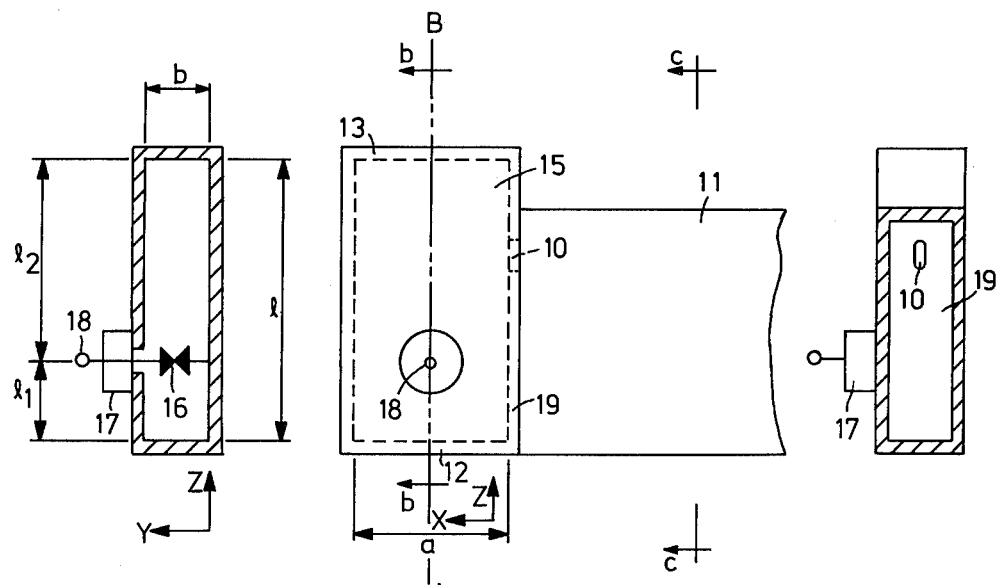
FIG. 3b
FIG. 3a
FIG. 3c

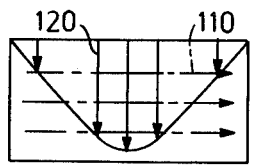
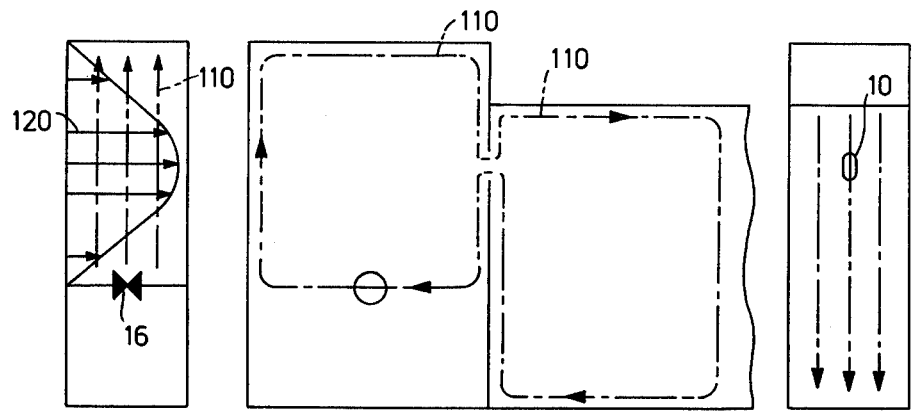
FIG.4c
FIG.4b  FIG.4a  FIG.4d
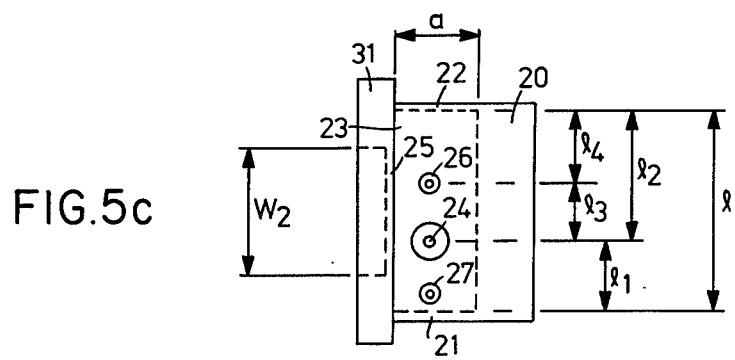
FIG.5c
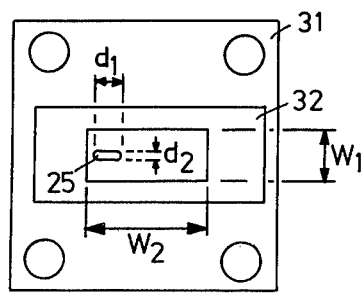
FIG.5b
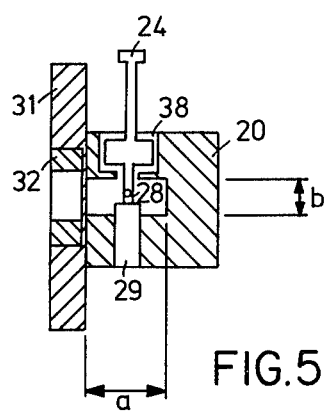
FIG.5a

OUTPUT COUPLING CIRCUIT FOR A CAVITY OSCILLATOR

The present invention relates to an oscillator apparatus, and more particularly to a microwave oscillator apparatus, having a microwave oscillator element disposed in a resonator and being adapted to generate a microwave signal with a fundamental oscillating frequency equal to a resonant frequency of the resonator.

A microwave signal is generated by applying a bias to a microwave oscillator element (for instance, a Gunn diode, an IMPATT diode, a transistor, etc.) disposed in a rectangular cavity of a resonator. The resonator is formed of a rectangular waveguide having a cavity enclosed by conducting walls. Accordingly, the electromagnetic modes of the propagated microwave are transverse electric (TE) modes. The dominant mode of the TE modes is the $TE_{10}$ mode, which has the longest cutoff wavelength. On the other hand, the oscillating frequency is determined by the resonant frequency of the resonator having a rectangular cavity. Accordingly, the resonator must be designed at an optimum depending upon a desired oscillating frequency. Especially, the resonant frequency is determined by a length and a width of a cavity.

However, even with an optimally designed resonator, it is difficult to make an oscillator which generates a satisfactory microwave signal, with no noise signal, at the current status of the art. The reason therefor is that the generated microwave signal includes harmonic signals in the higher frequency bands besides the oscillating signal with a fundamental frequency of oscillation. These higher harmonic signals are undesired signals having electromagnetic energy in the frequency bands equal to integral multiples of the fundamental frequency. These undesired signals are noise in a microwave communication system, Doppler radar system, etc., and thus become a principal cause for largely degrading the transmission characteristics.

In the prior art, provision was made for a filter which was inserted into a transmission path of a microwave signal to attenuate the undesired signals in the higher harmonic bands. However, if a filter is interposed in a transmission path, there may be various undesirable shortcomings such as a mismatching of an impedance between the filter and the transmission path, reflection of a microwave signal by the filter, and degradation of the transmission characteristics. Furthermore, there was a disadvantage in that an adjustment of the filter was very complex and difficult. Morever, with the conventional filter one could obtain only an attenuation characteristic of at most about −20 to −30 dB. Therefore, a microwave communication system, a radar, etc. which required an attenuation characteristic of −40 dB or higher, was compelled to use a very expensive filter.

It is a principal object of the present invention to provide an oscillator apparatus for generating a microwave signal, in which undesired signals are suppressed. Another object of the present invention is to provide novel structure for stably applying a dominant mode of a generated microwave at a resonant frequency to a waveguide set at an output portion.

Still another object of the present invention is to provide an oscillator apparatus which can be coupled with a transmission system without a filter for attenuating undesired signals.

The oscillator apparatus, according to the present invention, comprises a microwave oscillator element, a resonator with a cavity enclosed with conducting walls and containing the microwave oscillator element therein. A biasing device applies a bias voltage to the microwave oscillator element to generate a microwave signal. An output means guides the microwave signal. A microwave coupling circuit takes out the microwave signal from the resonator in a direction which is perpendicular to the direction of propagation of the microwave signal in the resonator and applies the taken-out microwave signal to the output means. The microwave coupling circuit is provided at a position which corresponds to one of the nodes of the electric field appearing in the cavity. It is desired for the coupling circuit to be disposed at the position on the resonator wall which is a half-guide wavelength away from the oscillator element.

According to the present invention, the output microwave signal is excited to have a fundamental oscillating frequency which is equal to the resonant frequency of the resonator and is derived, via the microwave coupling circuit, in the direction (the direction of an X-axis) perpendicular to the direction (the drection of a Z-axis) of propagation of the generated microwave signal in the resonator. Moreover, the output microwave signal is coupled to the output means by the microwave coupling circuit which is provided at the node of the electric mode, that is, at the position where the intensity of the electric field in the standing wave form becomes maximum. Consequently, the undesired signals (especially electromagnetic energy component of the second harmonics signal appearing at the frequency band twice as high as the fundamental oscillating frequency) can be effectively suppressed in the output means. According to the results of experiments obtained from the oscillator apparatus embodying the present invention, the second harmonic signal could be suppressed by −44 dB or more without making use of a filter.

As will be clearly seen from results of experiments, the oscillator apparatus according to the present invention can be applied to an oscillating mechanism in a microwave communication system, a radar, or the like, system without making use of an expensive filter and its controller. Especially, owing to the absence of adverse effects caused by a filter, the oscillator apparatus can have a high oscillating efficiency without a loss of oscillating power.

Figure 6:
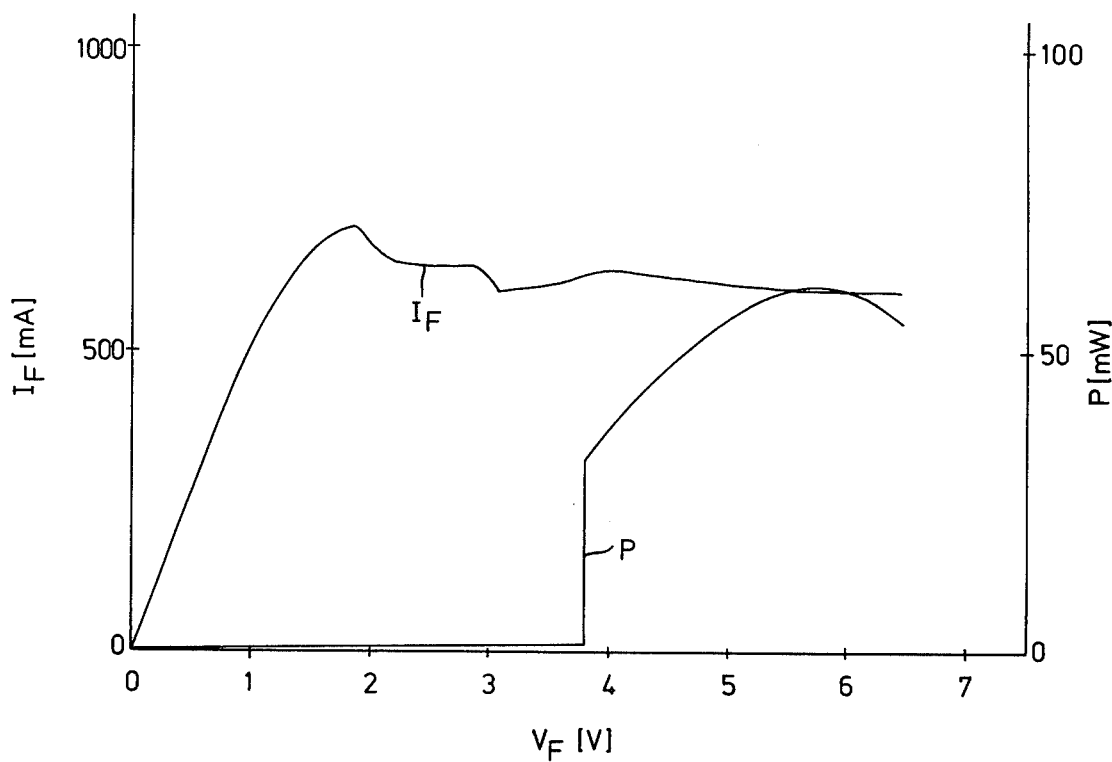
Figure 7:
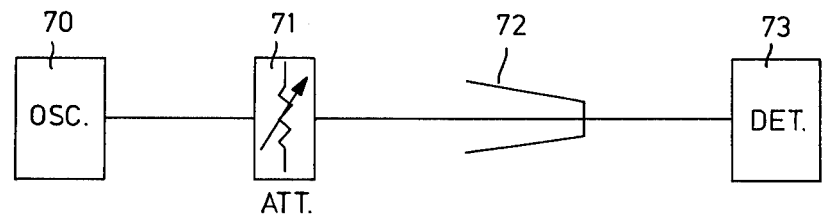
Figure 8:
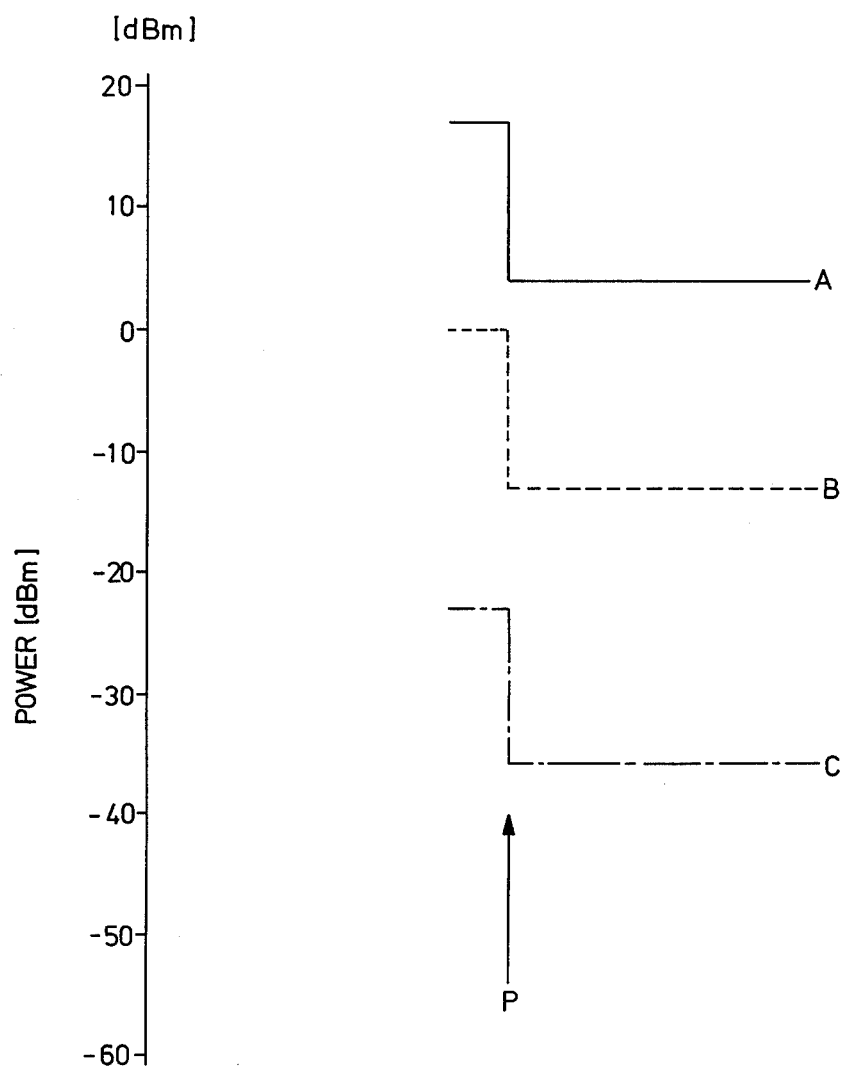

The other objects and advantages of the present invention will become more apparent from the following description of a preferred embodiment of the invention taken in conjunction with the accompanying drawings, wherein:

FIGS. 1(a), 1(b), 1(c) and 1(d) are a perspective view, an X-Y cross-sectional view, a Y-Z cross-sectional view and an X-Z plan view, respectively, of a rectangular waveguide having its opposite ends short-circuited;

FIGS. 2(a), 2(b) and 2(c) are a plan view, a cross-sectional view and a side view as seen from an output side, respectively, of an oscillator in the prior art;

FIGS. 3(a), 3(b) and 3(c) are a plan view, a cross-sectional view and a side view as seen from an output side, respectively, of an oscillator constructed according to the present invention;

FIGS. 4(a), 4(b), 4(c) and 4(d) are a plan view, a left side view, a top side view and a right side view as seen from an output side, respectively, showing an electromagnetic field distribution of the $TE_{1,0,1}$ mode within an resonator part according to the present invention;

FIGS. 5(a), 5(b) and 5(c) are a cross-sectional view, a plan view and a top view, respectively, of a Gunn oscillator according to one preferred embodiment of the present invention;

FIG. 6 is an oscillation characteristic diagram of the Gunn oscillator according to the illustrated embodiment;

FIG. 7 is a block diagram showing a construction of a measurement device for a second harmonic signal generated by the Gunn oscillator according to the illustrated embodiment; and FIG. 8 is a characteristic diagram showing electric power ratios of a second harmonic signal to a fundamental signal in the oscillator according to the illustrates embodiment and in the heretofore known oscillator, respectively.

At first, magnetic and electric field lines of a microwave signal propagating through a rectangular waveguide having its opposite end short-circuited by conductors will be explained, with reference to FIGS. 1(a) to 1(d). This waveguide is used as a resonator of the present invention, and the microwave signal is generated by an oscillator element. The microwave signal with the magnetic and electric field lines explained in FIG. 1. is used as a fundamental signal of the oscillator.

FIG. 1(a) is a perspective view of a rectangular waveguide having its opposite ends short-circuited. Defining now X-, Y- and Z-axes with respect to a center of a coordinate system taken at point 0, as shown in this FIG. 1, a distance a is defined as a width of a cavity, a distance b is defined as a height of the cavity and a distance c is defined as a length of the cavity. Taking the direction of propagation of a microwave signal propagating through the waveguide along the Z-axis direction, then the microwave signal would have electromagnetic field components of a $TE_{m,n}$ mode.

Normally, a resonant frequency of a resonator is determined with reference to the lowest cut-off frequency. Accordingly, a fundamental mode of the microwave oscillation signal propagating through the resonator is a $TE_{10}$ mode. The $TE_{10}$ mode is a transverse electric mode propagating to the Z-axis direction and has a single magnetic loop within the cavity. Therefore, the distance c is made somewhat larger than the lowest cut-off wavelength, to make a single loop of a magnetic field H in the Z-axis direction. This magnetic field loop of a standing wave is indicated by dash-dot line in FIGS. 1(b), 1(c) and 1(d). The magnetic field has the same intensity along the height direction (the Y-axis direction).

Figure 1B:
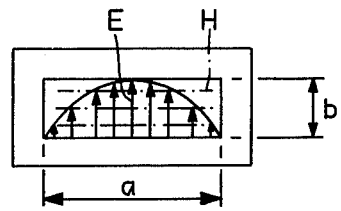
Figure 1C:
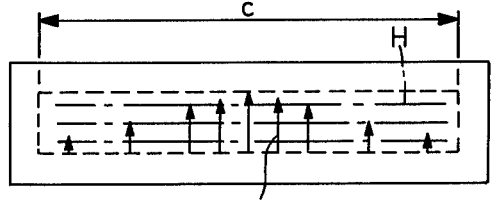
Figure 1D:
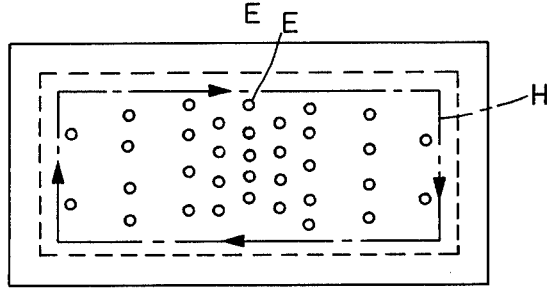

Here it is to be noted that FIGS. 1(b), 1(c) and 1(d), respectively, show electromagnetic field distributions along a transverse plane (X-Y plane), a side plane (Y-Z plane) and a top plane (X-Z plane) of a resonator. Inside of the single magnetic field loop appears an electric field E, directed in the Y-axis direction. The electric field is indicated by solid lines. The intensity of the electric field E is strongest at the center of the waveguide and becomes weak at the opposite edge portions, because of the short-circuit.

In the followings, a description will be made of the conventional oscillator which employs the $TE_{10}$ mode as an oscillation mode. FIGS. 2(a), 2(b) and 2(c) are a plan view, a cross-sectional view taken along a plane A—A' and a right side view of the conventional oscillator in the prior art.

The heretofore known oscillator comprises a resonator 5 and a waveguide 1. The resonator 5 is constructed of a rectangular waveguide having a uniform characteristic impedance, and has one end short-circuited by a metallic short-circuit plate 2. An oscillator element 6 is provided at a position separated from the metallic short-circuit plate 2 by a distance $l_1$, in the direction of the propagation of a microwave signal (in the Z-axis direction in FIG. 1). At a position separated from the oscillator element 6 by a distance $l_2$ is a microwave coupling plate 3 made of metal. As will be seen in FIG. 2(c), the microwave coupling plate 3 has an aperture (a coupling aperture 4) formed at its center portion so that an electromagnetic wave may be propagated to the waveguide 1, through this coupling aperture 4. In addition, a bias voltage for the oscillator element 6 is applied between a bias terminal 8 and the waveguide constituting the resonator 5. Normally a reference potential (the ground potential) is applied to the waveguide.

Between the bias terminal 8 and the oscillator element 6 is a high-stop filter 7, which prevents the generated microwave signal from leaking through the bias terminal 8 and also which enhances a Q (the quality factor of the frequency selectivity in the resonator) of the resonator 5.

In the heretofore known structure shown in FIGS. 2(a) to 2(c), it will be readily appreciated that the resonator portion between the oscillator element 6 and the microwave coupling plate 3 is identical to the structure shown in FIGS. 1(a) to 1(d), because the X-Y plane including the oscillator element 6 may be considered effectively a short-circuited plane equal to the one end plane short-circuited in FIGS. 1(a) to 1(d). Accordingly, when a bias voltage is applied to the oscillator element 6, the same electromagnetic field mode as that shown in FIGS. 1(b) to 1(d) appears in the hollow, empty waveguide portion between the plane A—A' and the microwave coupling plate 3 in FIGS. 2(a) to 2(c). This electromagnetic field mode is magnetically coupled via the coupling aperture 4 to the waveguide 1, connected to the resonator 5, along the same direction as the direction of propagation of the microwave (the Z-axis direction). Further, in the illustrated structure, when the distance $l_1$ is preset to be as long as about ¼ of the guide wavelength of the microwave signal propagating through the resonator 5 and when the distance $l_2$ is preset to be as long as about ½ of the guide wavelength, the conditions for sustaining an oscillation can be fulfilled.

In this prior art oscillator, however, when a fundamental microwave signal with a predetermined oscillating frequency, for example 24.15 GHz, is generated and propagated, several undesired signals with higher frequencies necessarily concides with the fundamental signal. Moreover, a higher harmonic microwave signal, in the frequency band (for example about 48 GHz) about twice as high as the oscillating frequency, has the largest power in those undesired signals. Upon measuring the electric power of this harmonic microwave signal (a second harmonic signal), only an attenuation of about −17 dB was observed with respect to the fundamental microwave signal. Accordingly, if the oscillator is used in itself as a microwave oscillator, it provides the second harmonic signal as a noise signal. Therefore, the oscillator had to be associated with a filter adapted to further attenuate the second harmonic signal in the higher frequency band (for example 48 GHz band) by about −40 to −50 dB for the fundamental signal power, on the output side of the waveguide 1. As a result of the association of the filter, the second harmonic signal could be attenuated by about $-40$ to $-50$ dB. However, one could not obviate the remarkable filter caused degradation of oscillation efficiency and of transmission efficiency (for example, this might be caused by a reflection of the microwave signal to the oscillator side and mismatching of impedances in transmission system).

Now, the basic construction of the oscillator, according to the present invention, which could eliminate the aforementioned shortcomings, will be explained with reference to FIGS. 3(a) to 3(c). FIGS. 3(a), 3(b) and 3(c) are a plan view, a cross-sectional view along a plane B—B' and a side view as seen from an output side, respectively.

A resonator 15 is a rectangular resonator containing a cavity enclosed with conducting walls which form a waveguide. This cavity is constructed to have the size of b in height, a in width and l in length. The opposite ends of the cavity are short-circuited by metellic short-circuit plates 12 and 13 or are terminated by something else. The oscillator element 16 is a 2-terminal semiconductor element such as a Gunn diode, IMPATT diode or the like or a 3-terminal element such as a transistor having a negative resistance. The oscillator element 16 is provided at a position which is separated from the metallic short-circuit plate 12 by a distance $l_1$ and separated from one side wall by a distance a/2 (that is, at the center of the width a of the major wall plane (X-Z plane)). It is to be noted that the coordinate system (X, Y, Z) shown in FIGS. 3(a) and 3(b) is the same as the coordinate system shown in FIG. 1(a). Furthermore, at a position separated from the oscillator element 16, by a distance $l_2$, is the other metallic short-circuit plate 13. A bias voltage for the oscillator element 16 is applied from a bias terminal 18 via a high-stop filter 17.

In the above-described structure, the distance $l_1$ is preset to be as long as about ¼ of the guide wavelength of the determined fundamental microwave signal which is propagating in the Z-axis direction through the resonator 15. Also the distance $l_2$ is preset to be as long as about ½ of the guide wavelength.

On the other hand, provision is made so that the microwave signal generated in the resonator 15 may be taken out from a predetermined position on the side wall 19 of resonator 15. More particularly, in the side wall 19 is a coupling 10 having an elongated shape with semicircular ends. The aperture is located at a position which is nearly midway between the oscillator element 16 and the metallic short-circuit plate 13. The generated microwave signal is magnetically coupled through the aperture 10 and to the side of the waveguide 11 which is fixed on the side wall 19 of resonator 15, to cover the aperture 10. This waveguide 11 acts as an output mean and is used a standard waveguide. As will be best seen from the illustrated structure, the present invention is characterized in that provision is made so that the generated microwave signal is derived in the direction (the X-axis direction) perpendicular to the direction of propagation (the Z-axis direction), within the resonator.

In the aforementioned structure, a single magnetic field loop, as shown in FIGS. 1(a) to 1(d), appears in the X-Z plane within the resonating section and between the oscillator element 16 (FIG. 3) and the metallic short-circuit plate 13. On the other hand, electric field lines of a standing wave appear in such manner that the intensity of the electric field is maximum at the center portion of the magnetic field loop and is reduced to a minimum at the peripheral portion of the loop, because the walls are short-circuit and at a ground potential. Such magnetic and electric modes of a standing wave are illustrated in FIGS. 4(a) to 4(d). FIG. 4(a) is a representation of a magnetic field mode along the X-Z plane. FIG. 4(b) is a representation of an electromagnetic field mode as viewed from the output side. Reference numeral 110 designates a magnetic field mode, and reference numeral 120 designates an electric field mode. The illustrated electric and magnetic field distributions are equal to the distribution of a $TE_{101}$ mode. This mode is of the fundamental microwave signal generated within the resonator and can be easily magnetically coupled to the waveguide side via the coupling aperture 10. Within the waveguide 11, the coupled microwave signal is propagated to the other end portion with the same $TE_{1,0,1}$ mode.

The aforementioned structure was measured when the higher harmonic signal (the second harmonic signal appearing in the 48 GHz band) for the fundamental microwave signal (having an oscillating frequency of 24.15 GHz) was generated by the oscillator. This measurement confirmed that the electric power of the second harmonic signal was attenuated by about $-40$ to $-50$ dB with respect to the power of the fundamental microwave signal. Therefore, according to the present invention, it is possible to transmit the predetermined fundamental microwave signal generated by the oscillator without adding a filter to the output side of the oscillator. In other words, it was proven that the higher harmonic signals, especially the second harmonic signal, can be sufficiently suppressed by deriving the generated fundamental microwave signal in the direction perpendicular to the direction of propagation of the fundamental microwave signal within the resonator.

In the following, one preferred embodiment of the present invention will be described in greater detail. In this preferred embodiment, a Gunn diode oscillator generates a microwave signal in a $TE_{101}$ mode having an oscillating frequency of 24.15 GHz (1) Design procedure for a resonator:

If the resonant frequency of the resonator (=the oscillating frequency of the Gunn diode) is determined at 24.15 GHz, the distance $l_2$ in FIG. 3 is determined by the following equation:

$$l_2 = \frac{1}{2} \times \frac{\lambda_o}{\sqrt{1 - \left(\frac{\lambda_o}{2a}\right)^2}} \quad (1)$$

where $\lambda_o$ represents a wavelength in free space of a desired oscillating frequency, and a represents a width of a waveguide of the resonator.

A wavelength $\lambda_c$ of a cut-off frequency of a microwave signal with a $TE_{mn}$ mode propagating through a waveguide is represented by the following equation:

$$\lambda_c = \frac{2}{\sqrt{\left(\frac{m}{a}\right)^2 + \left(\frac{n}{b}\right)^2}} \quad (2)$$

where a is a width of the waveguide, b is a height of the waveguide, the integers m and n pertain to the number of standing wave interference maxima occuring in the field solutions that describe the variation of the fields along the two transverse coordinates. Therefore, m represents a number of waves standing along the width (along the X-axis) and n represents a number of waves standing along the direction of height (along the Y-axis).

In a $TE_{10}$ mode, since $m=1$ and $n=0$ are fulfilled, Equation (2) above is reduced into the following form:

$$\lambda_c = 2a \ldots \quad (3)$$

In addition, representing the desired oscillating frequency by f, the free space wavelength $\lambda_o$ can be represented by the following equation:

$$\lambda_o = \frac{c}{f[GHz]} \text{ [mm]} \quad (4)$$

where c is a light velocity represented in the units of $10^6$ m/sec, that is, 300.

It is to be noted that if a resonator is produced exactly according to the above equations, the frequency at which the oscillator oscillates, in practice, becomes lower than the desired frequency. Therefore, the resonator is designed by assuming a frequency that is about 5 to 10% higher than the desired frequency. In the illustrated embodiment, if the desired oscillation frequency f is 24.15 GHz, 26 GHz is chosen for the calculation value f'. As a result, Equation (4) gives the free space wavelength $\lambda_o = 300/26 = 11.5$ [mm]. On the other hand, assuming that the wavelength $\lambda_c$ of the cut-off frequency is given by $\lambda_c = 14.4$ [mm], $a = 7.2$ [mm] can be derived from Equation (3). Accordingly, from Equation (1) above, the distance $l_2$ is given by $l_2 = 9.6$ [mm].

The distance $l_2$ is determined as a result of the above calculation, and thereby the resonant frequency of the resonator can be defined. However, it is more favorable to preset the resonant frequency at a value that is about 5 to 10% higher than the desired value, taking into consideration the temperature-dependent characteristics. According, the distance $l_2$ is made somewhat shorter than the calculated value, and in the illustrated embodiment it is selected at 9.1 [mm]. On the other hand, the distance $l_1$ could be selected at about $\frac{1}{2} \times l_2$. However, since this distance $l_1$ is not an extremely precisely calculated value, in practice, it is desirable to make fine adjustment so that the intensity of the electric field of the generated microwave signal may become minimum at the position of the metallic short-circuit plate 12 shown in FIG. 3(a).

(2) Selection of the position of the coupling window:

The coupling aperture 10 FIGS. 3(a) and 3(c) is formed in such a shape that a magnetic field can be coupled through it. The position of the aperture 10 could be located at the position where the intensity of the electric field of the fundamental signal of a standing wave becomes maximum along the direction of propagation through the resonator. In the illustrated embodiment, an elongated aperture with semi-circular ends was employed. It is to be noted, however, that the shape of the aperture could also be circular, elliptic, arcuated or inverse-U-shaped. The important criteria is for the aperture to hold an orientation parallel to the magnetic field line within the resonator.

The size of the elongated coupling aperture of the shape employed in the illustrated embodiment was 3 mm in length and 1 mm in width. The center of the coupling aperture 10 was located nearly at the midpoint between the Gunn diode 16 and the metallic short-circuit plate 13 (FIG. 3(a)) along the lengthwise direction of the resonator 15, that is, along the Z-axis direction in FIG. 1 (i.e. at a distance of 4.5 mm from the Gunn diode along the Z-axis direction).

(3) Connecting position of a waveguide:

The waveguide 11 is used output means (FIG. 3(a)). A standard waveguide has an open end of 10.7 mm in width and 4.3 mm in height. This waveguide is connected to the side surface of the resonator 15 so that the one open end may include the coupling aperture 10. Especially, it is preferable to position the waveguide 11 so that the center of the open end may be laterally deviated from the center of the coupling aperture 10. In the illustrated embodiment the waveguide 11 was connected to the resonator 15 with the center of the open end deviated by about 2.5 mm from the center of the coupling aperture 10. In addition, in the illustrated embodiment, the waveguide was provided with a flange to facilitate its connection to an external transmission path or load.

A more detailed structure of the oscillator for one preferred embodiment of the present invention, which was constructed in the above-described manner, is shown in FIGS. 5(a) to 5(c). FIGS. 5(a), 5(b) and 5(c) are a cross-sectional view, a front view and a top view, respectively, of the oscillator. A resonator 20 includes a cavity 23 having its opposite ends 21 and 22 short-circuited by metallic plates. A width a of the cavity is 7.2 mm, a height b is 3 mm and a length l is 13.6 mm. A distance $l_1$ from one end 21 to a bias terminal 24 of a Gunn diode 28 is 4.5 mm, and a distance $l_2$ from the bias terminal 24 to the other end 22 is 9.1 mm.

At the midpoint between the bias terminal and the other end 22 is an elongated coupling aperture 25 with semi-circular ends having a length $d_1 = 3$ [mm] and a width $d_2 = 1$ [mm]. The distances $l_1$ and $l_2$ from the center of this elongated coupling window 25 to the bias terminal 24 and the other end 22 of the cavity 23 are equal to each other and selected at 4.55 mm. In addition, at the midpoint between the bias terminal 24 and the other end 22 and just at the center of the width of the major wall plane of the cavity 23, a dielectric rod 26 made of titanium-series ceramic. Rod 26 is inserted vertically into the cavity 23. Moreover, between the bias terminal 24 and the one end 21 of the cavity is inserted an electromagnetic wave absorber 27 (epoxy+carbon).

One electrode of the Gunn diode 28 is connected to the bias terminal 24 and the other electrode is connected to a terminal 29 to be eventually connected to the body of the resonator 20. The terminal 29 is grounded. However, this may be fixed potential.

Moreover, between the bias terminal 24 and the resonator 20 is interposed a dielectric plate (polyimide plate) 30. This plate serves as a high-stop filter for preventing the generated microwave signal from leaking to the side of the bias terminal 24. To one side wall of the resonator is connected a waveguide 32 having a flange 31 containing a coupling aperture 25 therein. For this waveguide 32, a standard waveguide having a height $W_1$ of an open end of 4.3 mm and a width $W_2$ of 10.7 mm was used.

In the above structure, the dielectric rod 26 is provided for adjusting the oscillating frequency of the actually generated microwave signal so as to have a desired frequency. Also, the electromagnetic wave absorber 27 is provided for accelerating the build-up of oscillation.

The oscillation characteristics of the Gunn oscillator having the above-described structure is shown in FIG. 6. This figure represents the results of an experiment measuring a bias voltage $V_F$ vs. operating current $I_F$ characteristic and a bias voltage $V_F$ vs. output power P characteristic. As will be seen from this figure, oscillation started at a bias voltage of 3.8 V. It is to be noted that when the bias voltage was 5.4 V, an operating current of 600 mA, an output power of 58 mW and an oscillation frequency of 24.15 GHz were observed. In addition, a temperature-dependent variation of a frequency per degree was −380 KHz/°C.

Now, the results of measurement for higher harmonic signal of the microwave signal generated by the oscillator will be disclosed. The term "higher harmonic signal" as used herein means the higher harmonic microwave signal appearing in the 48 GHz band. As a measuring device, the device shown in FIG. 7 was employed. More particularly, a microwave signal derived from a waveguide of a Gunn oscillator 70 was attenuated by 13 dB by means of an attenuator (ATT) 71, and further only the higher harmonic signal was drived via a tapered waveguide 72 and then measured by a detector 73.

The results of measurements are shown in FIG. 8. This figure shows power ratios of the second harmonic signal (i.e. the undesired microwave signal at the frequency band of 48 GHz) with respect to the microwave signal (having an oscillating frequency of 24.15 GHz) oscillating in the $TE_{10}$ mode. In FIG. 8, a solid line A represents a power ratio of the microwave signal of 24.15 GHz, a dotted line B represents a power ratio of the undesired microwave signal in the 48 GHz band generated by the oscillator in the prior art, and a dash-dot line C represents a power ratio of the undesired microwave signal in the 48 GHz band, generated by the oscillator according to the above-described embodiment of the present invention.

As will be best seen from FIG. 8, in contrast to the fact that the undesired signal was attenuated by only −17 dB by the oscillator in the prior art, it could be attenuated by as much as −40 dB according to the present invention. It is to be noted that a point P indicated in FIG. 8 represents the point where the microwave power was attenuated by −13 dB by the attenuator 71. The attenuator 71 is provided for attenuating the microwave power to a level that is measurable by the detector 73.

As will be apparent from the above description, a fundamental microwave signal can be selectively taken out from the oscillator, and the remainder signals of the, especially the second harmonic signal can be sufficiently suppressed, by making a provision such that the microwave signal may be derived at the position where the intensity of the electric field becomes maximum along the direction of propagation through the resonator (the position of 2n−1/2 of guide wavelength) and also in the direction perpendicular to the direction of propagation, as is the case with the above-described preferred embodiment.

The reason for such effects is believed to be that the undesired signal is hardly coupled from the resonator to the waveguide because in the $TE_{10}$ mode, the fundamental wave signal is coupled to the waveguide at the point where a discontinuity of a magnetic field loop would appear for the undesired signal whose cut-off wavelength is ½ of that of the fundamental wave signal (that is, the signal in the 48 GHz band). In addition, it is thought that the second harmonic mode for the $TE_{10}$ mode (that is, the $TE_{20}$ mode), could not easily propagate through the waveguide and would be attenuated promptly. This attenuation occurs since the coupling is made at a point where a phase is different by 90 degrees, even if the $TE_{20}$ mode should appear on the waveguide side. Hence, only the fundamental microwave signal of 24.15 GHz could propagate stably. Furthermore, it is surmised that since the center of the coupling aperture and the center of the waveguide do not coincide with each other, the electromagnetic field distribution of the $TE_{20}$ mode will become asymmetric within the waveguide of the output side, resulting in reduction of coupling intensity.

It is to be noted that, in the above-described embodiment, although an example of magnetically coupling a resonator to a waveguide by making use of an elongated coupling aperture having semi-circular ends, was disclosed, a modification could be made such that electrical coupling is employed by forming the coupling aperture in a circular or vertically elongated shape. Further, a circular waveguide, coaxial transmission line or the well-known transmission means may be used as an output side instead of the waveguide of the present embodiment. In that case, a probe coupling or loop coupling by using a central conductor of the coaxial transmission line may be used as coupling means instead of the coupling aperture. It is, however, noted that a coupling position must correspond with the position of the coupling aperture shown in the embodiment.

What is claimed is:

1. An oscillator comprising:
    a cavity resonator having a rectangular cavity comprising a lower wall, an upper wall, a first, a second, a third, and a fourth side wall;
    an oscillator element means for generating an oscillating signal, said oscillator element means being mounted in said cavity resonator on the side of said lower wall at a position which is offset from the center line between said upper and lower walls of said cavity;
    a biasing means for energizing said oscillator element means;
    a waveguide fixed to said first side wall of said cavity resonator for delivering the signal generated by the oscillator element means, said waveguide having a lower wall, an upper wall, and two side walls, the lower wall of said waveguide and said lower wall of said cavity being positioned in the same plane; and
    a signal coupling aperture in said first side wall of said cavity resonator for transmitting said signal generated by said oscillator element means from said resonator to said waveguide, said signal coupling aperture being located on the side of said upper wall of said cavity at a position which is offset from said center line of said cavity and which is offset from the center line between said upper and lower walls of said waveguide.

2. The oscillator as claimed in claim 1, wherein said signal coupling aperture is located at a position which is different from said oscillator element means by ¼ of a wavelength of said signal.

3. The oscillator as claimed in claim 2, wherein said signal coupling aperture has a semi-circular shape which is elongated along a line which is parallel to the magnetic lines within said resonator.

* * * * *